(12) United States Patent
Morikawa et al.

(10) Patent No.: US 8,421,891 B2
(45) Date of Patent: Apr. 16, 2013

(54) A/D CONVERSION APPARATUS USING GRAY CODE COUNTER, SOLID-STATE IMAGE CAPTURING APPARATUS AND ELECTRONIC INFORMATION DEVICE

(75) Inventors: Yoshinao Morikawa, Osaka (JP); Makoto Shohho, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 390 days.

(21) Appl. No.: 12/817,346

(22) Filed: Jun. 17, 2010

(65) Prior Publication Data

US 2010/0321547 A1 Dec. 23, 2010

(30) Foreign Application Priority Data

Jun. 17, 2009 (JP) ................... 2009-144667

(51) Int. Cl.
*H04N 3/14* (2006.01)
*H03M 7/04* (2006.01)
*H03M 1/12* (2006.01)
*H03M 1/36* (2006.01)

(52) U.S. Cl.
USPC ............... 348/294; 341/97; 341/98; 341/155; 341/159

(58) Field of Classification Search .................. None
See application file for complete search history.

(56) References Cited

U.S. PATENT DOCUMENTS

| | | | | |
|---|---|---|---|---|
| 6,028,546 A | * | 2/2000 | Signell et al. | ................. 341/161 |
| 7,149,275 B1 | * | 12/2006 | Hubbard | ......................... 377/47 |
| 2002/0022938 A1 | * | 2/2002 | Butler | ............................ 702/85 |
| 2002/0176194 A1 | * | 11/2002 | Ruegg et al. | .................... 360/51 |
| 2005/0092898 A1 | * | 5/2005 | Aibara et al. | ............. 250/214 A |
| 2009/0026352 A1 | | 1/2009 | Shimomura et al. | |
| 2009/0174586 A1 | * | 7/2009 | Muenter et al. | ............... 341/131 |
| 2009/0174588 A1 | * | 7/2009 | Muenter et al. | ............... 341/155 |
| 2009/0236012 A1 | * | 9/2009 | Gass et al. | .................... 144/427 |
| 2010/0110252 A1 | * | 5/2010 | Shimomura et al. | ........... 348/302 |

FOREIGN PATENT DOCUMENTS

| | | |
|---|---|---|
| JP | 2009-033297 | 2/2009 |
| JP | 2009-033297 | * 12/2009 |

OTHER PUBLICATIONS

Office Action dated Nov. 8, 2012 in corresponding Chinese Patent Application No. 201010207327.8.
Zhen-chang et al., "High Precision Duty Cycle Corrector with Fixed Falling Edge", Microelectronics, vol. 37, No. 5.

* cited by examiner

*Primary Examiner* — Lin Ye
*Assistant Examiner* — John H Morehead, III
(74) *Attorney, Agent, or Firm* — Edwards Wildman Palmer LLP; George W. Neuner

(57) ABSTRACT

An A/D conversion apparatus according to the present invention for comparing a reference signal with an analog signal, and when the reference signal matches with the analog signal, outputting a corresponding digital value, is provided, and the A/D conversion apparatus includes a gray code counter for generating the digital value from a reference clock or a reverse clock of the reference clock, and uses a gray code, in which a most significant bit to a second least significant bit of the digital value is a count value of the gray code counter and a least significant bit of the digital value is generated from the reference clock or the reverse clock thereof and defined as a least significant bit of the gray code counter.

20 Claims, 18 Drawing Sheets

A/D CONVERSION APPARATUS USING GRAY CODE COUNTER, SOLID-STATE IMAGE CAPTURING APPARATUS AND ELECTRONIC INFORMATION DEVICE

This nonprovisional application claims priority under 35 U.S.C. §119(a) to Patent Application No. 2009-144667 filed in Japan on Jun. 17, 2009, the entire contents of which are hereby incorporated by reference.

BACKGROUND OF THE INVENTION

1. Field of the Invention

The present invention relates to: an A/D conversion apparatus for converting an analog signal to a digital signal; a solid-state image capturing apparatus, in which analog pixel signals (image capturing signals) from a plurality of semiconductor elements are A/D converted in a column parallel by the A/D conversion apparatus and are subsequently processed with various image processing to obtain color image signals, the semiconductor elements being for performing a photoelectric conversion on and capturing an image of incident light from a subject; and an electronic information device, such as a digital camera (e.g., a digital video camera or a digital still camera), an image input camera (e.g., a monitoring camera), a scanner, a facsimile machine, a television telephone device and a camera-equipped cell phone device, including the solid-state image capturing apparatus as an image input device used in an image capturing section thereof.

2. Description of the Related Art

There is a conventional technique described in Reference 1, for example, as an A/D conversion method associated with a conventional solid-state image capturing apparatus. According to Reference 1, in a solid-state image capturing apparatus with a conventional built-in A/D conversion apparatus, it is possible to reduce noise and power consumption due to the driving of digital systems.

FIG. 18 is a block diagram illustrating an exemplary configuration of essential parts of a conventional solid-state image capturing apparatus disclosed in Reference 1.

In FIG. 18, a conventional solid-state image capturing apparatus 100 is provided with a plurality of pixels 101 functioning as a plurality of sensing elements for performing a photoelectric conversion on and capturing an image of incident light from a subject. These pixels 101 are arranged in rows and columns (in a matrix) to constitute a pixel section (pixel area) 102. The pixels 101 as sensing elements are constituted of, for example, a CCD sensor, a CMOS sensor or a near infrared ray sensor, constituted of photodiodes (PD), or a sensor that converts infrared rays into heat and further into electric signals. It goes without saying that the present invention is not limited to the examples of these sensors, but the examples may further include a sensing element, such as a pressure sensor and the like.

In FIG. 18, one gray code counter 103 is provided for the solid-state image capturing apparatus 100. The output of the gray code counter 103 is connected via a common signal line 104 to an A/D converter 105, which is constituted of a comparator 106 and a digital memory 107. One A/D converter 105 is provided for each column. Herein, three columns are illustrated in the example; however, the number of columns is a design choice and the present invention is not limited to this example. In addition, there may be a case where one A/D converter is provided for each column, one A/D converter is provided for two or more columns, or two or more A/D converters are provided for each column.

A digital/analog converter (DAC) 108 is connected to the gray code counter 103 via a gray code/binary converter 109, and they are operated in synchronism. At an A/D conversion, a triangle wave is output from the DAC 108 as a reference signal. In the comparator 106, data 110 from the pixels 101 is compared with the triangle wave. The digital memory 107 is selectively connected to a horizontal digital output line 111, and the horizontal digital output line 111 is connected to an output buffer 113 via a gray code/binary code converter 112. The above described members are formed on a semiconductor chip, and are output outside a sensor chip via the output buffer 113.

Each digital memory 107 is connected to the horizontal digital output line 111 via switches (not shown). By switching on each of the switches at a time, the output is made selectively from the digital memory 107 to the horizontal digital output line 111. A method for successively switching on switches includes a method for decoding an address using a switch pulse, a method for successively switching on switches for each column using a digital shift register, and the like. As described above, the selective output is successively performed from each digital memory 107 to the horizontal digital output line 111.

With the configuration described above, the plurality of pixels 101 are, first selectively scanned one row at a time, and each of output pixel signals is input into one of input terminals of the comparator 106.

Thereafter, the triangle signal as a reference signal which is synchronized from the DAC 108 to the gray code counter 103 is input into the other input terminal of the comparator 106. At the same time, a value of the gray code counter 103 is distributed to all the digital memories 107. The comparator 106 reverses an output signal at a time corresponding to the magnitude (output value) of an output pixel signal from the pixels 101. Using a reversed signal as a trigger, the digital memory 107 retains a count value in accordance with the reversed time instances, from the gray code counter 103 to perform the A/D conversion.

This A/D conversion result is sent to the gray code/binary code converter 112 via the horizontal digital output line 111. The gray code/binary code converter 112 converts the result into a binary code that can be handled by other digital devices, such as a CPU. The converted binary code is output from the output buffer 113 to the outside as data for each pixel 101.

The gray code counter 103 starts counting at a time when a triangle voltage of the triangle signal is started to be applied to the comparator 106, which is at a preceding stage of the digital memory 107. The output of the comparator 106 is reversed as a result of comparing the triangle voltage and the output value of the output pixel signal of the pixels 101, and a count value corresponding to the output, of the gray code counter 103 is output and retained by the digital memory 107. It is particularly important for an image sensor to include the DAC 108 built therein, and low noise characteristics are particularly important for such an image sensor because the image sensor deals with minute analog voltage. It is required to perform A/D conversion on analog pixel signals (image capturing signals) from the pixels 101 with low noise.

In the future, further noise reduction will be required in order to decrease the period of the triangle signal and decrease the period of the A/D conversion. Accordingly, it will be required to build the DAC 108 in the sensor and connect the output terminal of the DAC 108 to the A/D converter 105 in a shortest possible distance.

By building inside the gray code/binary code converter 112 for converting a gray code into a binary code and the DAC 108, the image sensor is capable of, while obtaining advancements of the gray codes, such as effects of low power consumption, low noise and the like, suppressing, to the minimum, disturbance between the output of the DAC 108 and the input section of the comparator 106 to perform accurate A/D conversion.

Reference 1: Japanese Laid-Open Publication No. 2005-347931

SUMMARY OF THE INVENTION

In order to increase a resolution of contrast in the conventional configuration described above, the resolution of the A/D converter 105 needs to be increased. For that purpose, the resolution of the A/D conversion needs to be increased. Further, for that purpose, a resolution of a gray code used in an A/D conversion circuit needs to be increased. Further, in order to increase the resolution of the gray code, a reference clock frequency needs to be increased. If a reference clock frequency is increased, the area occupancy will be increased by the gray code counter 103 (gray code producing circuit) and power consumption will also be increased by the gray code counter 103 (gray code producing circuit). In addition, in some manufacturing processes, there may be circuits that face their operational limits for the increase in the clock frequency.

The present invention is intended to solve the conventional problems described above. The objective of the present invention is to provide: an A/D conversion apparatus capable of suppressing the increase in area occupancy by a gray code counter and the increase in power consumption in the gray code counter; a solid-state image capturing apparatus including the A/D conversion apparatus used therein; and an electronic information device, such as a camera-equipped cell phone device, including the solid-state image capturing apparatus used as an image input device in an image capturing section thereof.

An A/D conversion apparatus according to the present invention is provided for comparing a reference signal with an analog signal, and when the reference signal matches with the analog signal, outputting a corresponding digital value, where the A/D conversion apparatus includes a gray code counter for generating the digital value from a reference clock or a reverse clock of the reference clock, and uses a gray code, in which a most significant bit to a second least significant bit of the digital value is defined as a count value of the gray code counter and a least significant bit of the digital value is generated from the reference clock or the reverse clock thereof and defined as a least significant bit of the gray code counter, thereby achieving the objective described above.

Preferably, in an A/D conversion apparatus according to the present invention, the gray code counter includes an output section of the least significant bit, and in the output section, the reference clock or the reverse clock thereof is input into a clock input terminal of a flip flop, data of the least significant bit is output from a data output terminal of the flip flop, and the data output terminal is connected to a data input terminal with an inverter interposed therebetween.

An A/D conversion apparatus according to the present invention is provided for comparing a reference signal with an analog signal, and when the reference signal matches with the analog signal, outputting a corresponding digital value, where the A/D conversion apparatus includes a gray code counter for generating the digital value from a reference clock or a reverse clock of the reference clock, and uses a gray code, in which a most significant bit to a third least significant bit of the digital value is defined as a count value of the gray code counter; a second least significant bit of the digital value is generated from the reference clock or the reverse clock thereof and defined as a second least bit of the gray code counter; and a least significant bit of the digital value is configured with a signal of a same period as that of another reference clock or another reverse clock thereof obtained by deviating one-fourth of a phase of the reference clock or the reverse clock thereof, thereby achieving the objective described above.

Preferably, in an A/D conversion apparatus according to the present invention, the gray code counter includes an output section of the second least significant bit, and in the output section, the reference clock or the reverse clock thereof is input into a clock input terminal of a flip flop, data of the second least significant bit is output from a data output terminal of the flip flop, and the data output terminal is connected to a data input terminal with an inverter interposed therebetween, thereby achieving the objective described above.

Preferably, in an A/D conversion apparatus according to the present invention, an output section of the least significant bit of the gray code counter is constituted of a signal generating circuit for generating a signal obtained by deviating one-fourth of a phase, of the reference clock or the reverse clock thereof.

Still preferably, an A/D conversion apparatus according to the present invention further includes a ramp waveform signal generating circuit for generating a ramp waveform signal as the reference signal.

Still preferably, an A/D conversion apparatus according to the present invention further includes a duty adjusting circuit capable of adjusting a duty ratio of the reference clock or the reverse clock thereof using a control signal, wherein duty adjustment of the duty adjusting circuit is controlled by switching the control signal in accordance with whether or not a fuse is disconnected, the fuse being electrically or physically disconnectable.

Still preferably, an A/D conversion apparatus according to the present invention further includes a duty adjusting circuit capable of adjusting a duty ratio of the reference clock or the reverse clock thereof using a control signal, wherein duty adjustment of the duty adjusting circuit is controlled by switching the control signal in accordance with whether or not there is a program for a non-volatile memory.

Still preferably, an A/D conversion apparatus according to the present invention further includes a duty adjusting circuit capable of adjusting a duty ratio of the reference clock or the reverse clock thereof using a control signal, wherein duty adjustment of the duty adjusting circuit is controlled by switching the control signal in accordance with whether or not a wire is connected to a pad capable of wire bonding.

Still preferably, in an A/D conversion apparatus according to the present invention, the signal generating circuit is configured with a delay circuit capable of switching a delay value using a control signal.

Still preferably, in an A/D conversion apparatus according to the present invention, the delay circuit includes: a first delay circuit, into which the reference clock or the reverse clock thereof is input; a second delay circuit, into which output data of the first delay circuit is input; and a logic circuit, into which each output data of the first delay circuit and the second delay circuit is input, so that delay by the first delay circuit, and delay by the first delay circuit and the second delay circuit can be switched from one another using the control signal.

Still preferably, an A/D conversion apparatus according to the present invention further includes a control signal generating circuit for generating the control signal.

Still preferably, in an A/D conversion apparatus according to the present invention, delay adjustment of the delay circuit is controlled by switching the control signal in accordance with whether or not an electrically or physically disconnectable fuse is disconnected.

Still preferably, in an A/D conversion apparatus according to the present invention, delay adjustment of the delay circuit is controlled by switching the control signal in accordance with whether or not there is a program for a non-volatile memory.

Still preferably, in an A/D conversion apparatus according to the present invention, delay adjustment of the delay circuit is controlled by switching the control signal in accordance with whether or not a wire is connected to a pad capable of wire bonding.

A solid-state image capturing apparatus according to the present invention includes therein an A/D conversion apparatus according to the present invention for performing an A/D conversion on an analog pixel signal read out from a plurality of pixels, the pixels generating a signal charge by a photoelectric conversion of incident light and capturing an image of the incident light.

Preferably, in a solid-state image capturing apparatus according to the present invention, the solid-state image capturing apparatus includes: a pixel area, in which the plurality of pixels are arranged in a two dimensional matrix; and a row selecting section for selecting each pixel row of the pixel area; and the pixel area outputs a pixel value of each pixel of a pixel row selected by the row selecting section, as the analog pixel signal, for each pixel column.

Still preferably, in a solid-state image capturing apparatus according to the present invention, the solid-state image capturing apparatus includes a plurality of column signal lines provided in the pixel area for the each pixel column, and to which the analog pixel signal is read from each pixel of a pixel row selected by the row selecting section; and the A/D conversion apparatus converts the analog pixel signal of each pixel, which is read out to each of the plurality of column signal lines simultaneously in a parallel column manner, into each digital pixel value.

An electronic information device according to the present invention includes the solid-state image capturing apparatus according to the present invention, used as an image input device, in an image capturing section thereof.

The functions of the present invention having the configurations described above will be described hereinafter.

According to the present invention, the A/D conversion apparatus compares a ramp waveform signal, as a reference signal, with an analog pixel signal, as an analog signal for each column, and outputs a digital pixel value Dpv, as a corresponding digital value, when both signals match each other. The A/D conversion apparatus uses a gray code in which the most significant bit to the second least significant bit of the digital pixel value Dpv is defined as a count value of a counter, which is an n-bit counter, and the least significant bit of digital pixel value Dpv is defined as a counter value generated from a reference clock CK or its reverse clock CKB. Note that the count value is a value a counter actually counts, whereas the counter value is a value which is output from the counter although the counter does not actually count.

As a result, it is possible to increase a resolution of A/D conversion by one bit only, thereby increasing the number of bits of the gray code used for an A/D conversion and performing image capturing with a higher color gradient without an increase in the reference clock frequency. Thus, even if a resolution of contrast is increased, it is possible to suppress the increase in area occupancy by the gray code counter and the increase in power consumption in the gray counter.

Further, according to the present invention, the A/D conversion apparatus compares a ramp waveform signal, as a reference signal, and an analog pixel signal, as an analog signal for each column, and outputs a digital pixel value Dpv, as a corresponding digital value, when both signals match each other. In addition, the A/D conversion apparatus uses a gray code with the definitions as follows: the most significant bit to the third least significant bit of the digital pixel value Dpv is defined as a count value of a counter, which is an n-bit counter; the second least significant bit of the digital pixel value Dpv is defined as the second least significant bit of the counter, generated from a reference clock CK or a reverse clock of the reference clock; and the least significant bit of the digital pixel value Dpv is a signal of the same period with a clock of one-fourth a phase deviation of the reference clock or its reverse clock, and is defined as the least significant bit of the counter.

As a result, the resolution of the A/D conversion can be increased by two bits, thereby increasing the number of bits of the gray code used for an A/D conversion and performing image capturing with a higher color gradient without an increase in the reference clock frequency. Thus, even if a resolution of contrast is increased, it is possible to suppress the increase in area occupancy by the gray code counter and the increase in power consumption in the gray counter.

According to the present invention with the configuration described above, the gray code used for an A/D conversion can be increased by one or two bits without increasing a reference clock frequency, thereby increasing a resolution of A/D conversion by one or two bits and performing image capturing with a higher color gradient. Therefore, even if a resolution of contrast is increased, it is possible to suppress the increase in area occupancy by the gray code counter and the increase in power consumption in the gray counter.

These and other advantages of the present invention will become apparent to those skilled in the art upon reading and understanding the following detailed description with reference to the accompanying figures.

Figure 1:
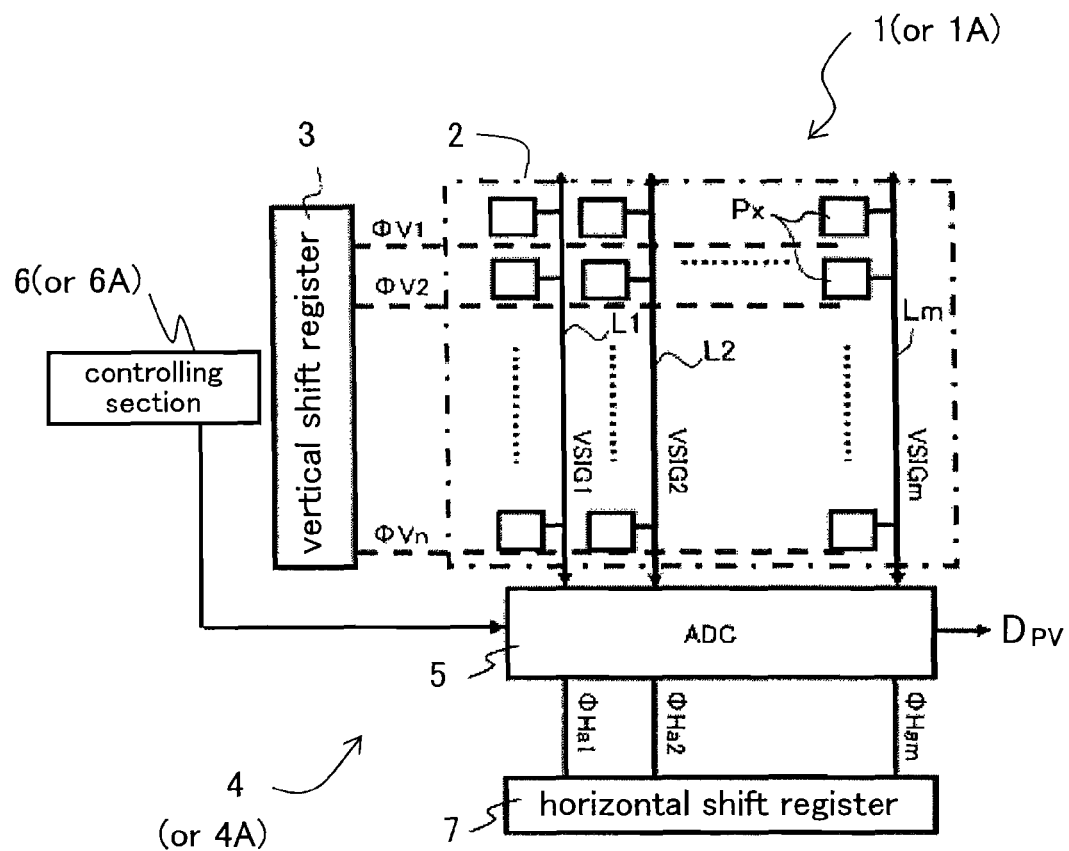
FIG. 1 is a block diagram illustrating an exemplary configuration of essential parts of a solid-state image capturing apparatus including an A/D conversion apparatus used therein, according to Embodiment 1 of the present invention.

1, 1A solid-state image capturing apparatus
2 pixel area
3 vertical shift register
4, 4A A/D conversion section (A/D conversion apparatus)
5 A/D conversion circuit (ADC)
5a A/D converter
51 CDS circuit
52 comparator
53 n-bit latch circuit
53a preceding stage n-bit latch
53b later stage n-bit latch
6, 6A controlling section
61 ramp waveform signal generating circuit
62, 62A n-bit counter (binary counter or gray code producing circuit)
620, 621 delay circuit
622, 624, 627 control signal generating circuit
623 fuse
625 non-volatile memory section
626 non-volatile memory writing circuit
628 pad (PAD)
63 duty adjusting circuit
64 control signal generating circuit
641a, 641b, 643a, 643b, 646a, 646b control signal generating circuit
642 fuse
644 non-volatile memory section
645 non-volatile memory writing circuit
647 pad (PAD)
7 horizontal shift register
8 signal processing section
9 conventional gray code producing circuit
Px pixel
ΦV1 to ΦVn selection pulse signal
L1 to Lm column signal line
ΦHa1 to ΦHam timing pulse signal
DApv difference analog pixel signal
Ts timing signal
Rs latch output
ΦHa(J) timing pulse
Dpv digital pixel value (digital value)
CK reference clock
CKB reverse clock signal
GCODE0 least significant bit of a gray code
GCODE1 second least significant bit of a gray code
P1-A, P1-B, N1-A, N1-B control signal
A, B delay circuit
SELA, SELB control signal
90 electronic information device
91 memory section
92 display section
93 communication section
94 image output section

DESCRIPTION OF THE PREFERRED EMBODIMENTS

Hereinafter, an A/D conversion apparatus and a solid-state image capturing apparatus including the A/D conversion apparatus used therein, of the present invention will be described in detail as Embodiments 1 and 2, and an electronic information device according to Embodiment 3, such as a camera-equipped cell phone device, including the solid-state image capturing apparatus according to Embodiment 1 or 2 as an image input device used in an image capturing section thereof, with reference to the accompanying figures.

Embodiment 1

Figure 2:
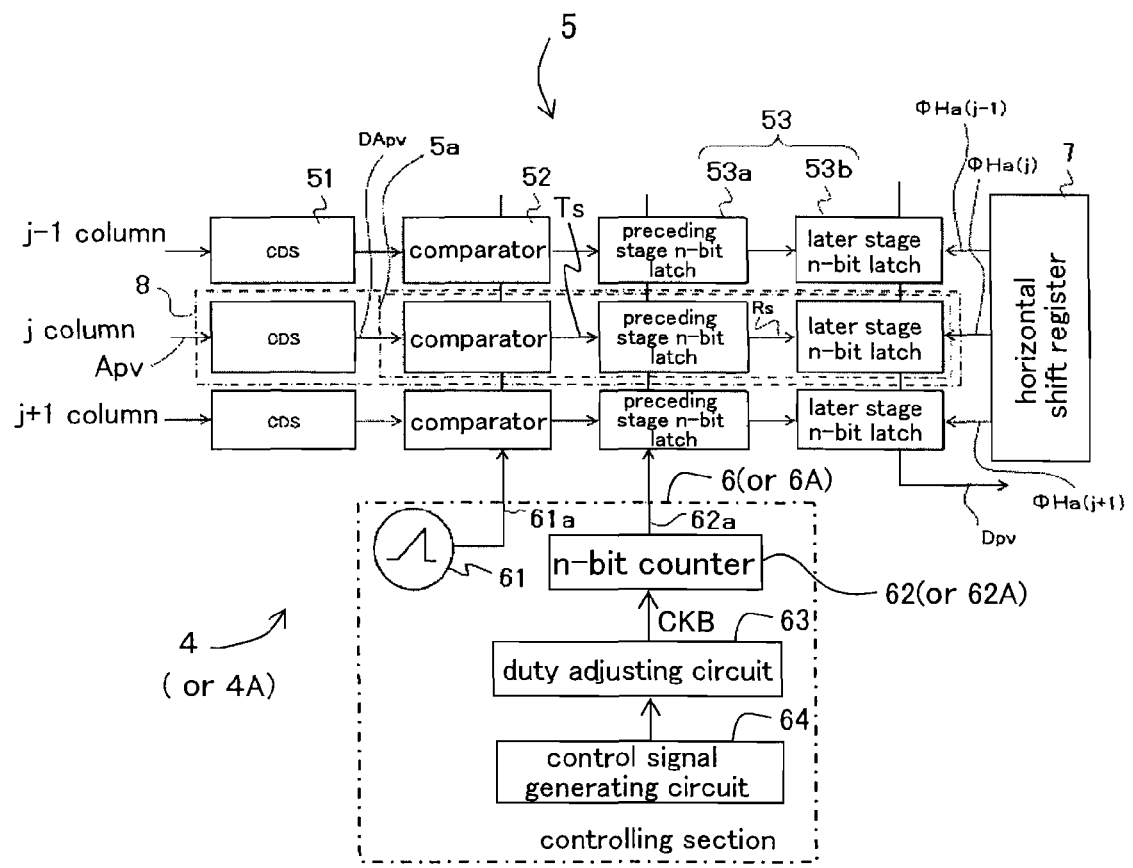
FIG. 2 is a block diagram illustrating a specific example of an A/D conversion apparatus in FIG. 1.

FIG. 1 is a block diagram illustrating an exemplary configuration of essential parts of a solid-state image capturing apparatus including an A/D conversion apparatus, according to Embodiment 1 of the present invention. FIG. 2 is a block diagram illustrating a specific example of the A/D conversion apparatus in FIG. 1.

In FIGS. 1 and 2, a solid-state image capturing apparatus 1 according to Embodiment 1 includes: a pixel area 2 in which a plurality of pixels Px (a light receiving section or a photoelectric conversion section) are arranged in a two dimensional matrix (n row×m column) for generating a signal charge by a photoelectric conversion of incident light and capturing an image; a vertical shift resister 3 as a row selection section for selecting each pixel row in the pixel area 2 using selection pulse signals ΦV1 to ΦVn; a plurality of column signal lines L1 to Lm, provided for each pixel column in the pixel area 2, through which an analog pixel signal is read out as an image capturing signal from each pixel Px in a pixel row selected by the vertical shift register 3; and an A/D conversion section 4 as an A/D conversion apparatus for performing A/D conversion on the analog pixel signal of the pixel Px, which is read out to each of the column signal lines L1 to Lm, into a digital pixel value and outputting the digital pixel value. The solid-state image capturing apparatus 1 successively outputs a pixel value of each pixel Px of a pixel row selected by the vertical shift register 3, as an analog pixel signal, for each column, and at the same time, performs an A/D conversion on the analog pixel signal of each column into a digital pixel value.

The A/D conversion section 4, functioning as the A/D conversion apparatus, includes: an A/D conversion circuit (ADC) 5 for performing an A/D conversion on analog pixel signals from pixels of a selected pixel row into digital pixel values simultaneously; a controlling section 6 for controlling the A/D conversion circuit 5 to convert analog pixel signals of the plurality of pixels Px of the selected pixel row into digital pixel values simultaneously; and a horizontal shift register 7 for outputting timing pulse signals ΦHa1 to ΦHam to the A/D conversion circuit 5 so that a digital pixel value Dpv of each pixel Px for each column is successively output, the digital pixel value Dpv obtained by the A/D conversion circuit 5.

As illustrated in FIG. 2, the A/D conversion circuit (ADC) 5 includes a plurality of A/D converters 5a. The A/D converters 5a are each provided for each of the column signal lines L1 to Lm (with m being an integer), for performing an A/D conversion on each analog pixel signal of the pixels Px of a selected pixel row into each digital pixel value Dpv, the analog pixel signal being read out to each of the column signal lines L1 to Lm. The A/D converters 5a are provided as many as the number of the column signal lines L1 to Lm.

Hereinafter, the A/D conversion circuit 5 and the controlling section 6 will be described in more details.

Herein, the A/D conversion circuit 5 performs an A/D conversion on each analog pixel signal, which was read out to each of the column signal lines L1 to Lm during a first horizontal blanking period THB1 in a horizontal period H(k) corresponding to each pixel row, during a remaining signal processing period HR(k) following a second horizontal blanking period THB2 in the horizontal period H(k) corresponding to each pixel row.

As illustrated in FIG. 2, the A/D conversion circuit 5 includes a CDS circuit 51 provided at a preceding stage of each A/D converters 5a and provided for each of the column signal lines L1 to Lm. The CDS circuit 51 samples a reset signal, which is read out as a dark period analog pixel signal to the column signal lines L1 to Lm, and a data signal, which is output as a long-time exposure analog signal to the column signal lines L1 to Lm, and outputs a difference analog pixel signal DApv thereof. Note herein that the CDS circuit 51 and the corresponding A/D converter 5a connected to the output side of the CDS circuit 51 constitute a signal processing section 8 in a corresponding manner for each column.

As illustrated in FIG. 2, each A/D converter 5a constituting the A/D conversion circuit 5 includes a comparator 52 and an n-bit latch circuit 53. The comparator 52 compares a constant level of a difference analog pixel signal DApv output from the CDS circuit 51 at the preceding stage, with a reference signal (triangle wave signal) in which a signal level is increased successively, and the comparator 52 outputs a timing signal Ts when the signal level of the reference signal exceeds the signal level of the difference analog pixel signal DApv. The n-bit latch circuit 53 latches a digital pixel value Dpv (output data from an n-bit counter 62) corresponding to a signal level of the difference analog pixel signal DApv when the timing signal Ts is input, and the n-bit latch circuit 53 subsequently outputs the digital pixel value Dpv.

The n-bit latch circuit 53 of the A/D conversion circuit 5 includes a preceding stage n-bit latch 53a and a later stage n-bit latch 53b. The preceding stage n-bit latch 53a latches a digital pixel value (output data from an n-bit counter 62) corresponding to a signal level of the difference analog pixel signal DApv on the basis of the timing signal Ts from the comparator 52. The later stage n-bit latch 53b retains a latch output Rs (digital pixel value Dpv) from the preceding stage n-bit latch 53a and outputs it by a timing pulse ΦHa (j) in a column selecting manner.

The later stage n-bit latch 53b of the signal processing section 8, corresponding to each column, receives the timing pulse ΦHa (j) from the horizontal shift register 7 and successively shifts the latch output (digital pixel value Dpv) of the preceding stage n-bit latch 53a of the signal processing section 8, corresponding to each column, in a column selecting manner. The later stage n-bit latch 53b subsequently outputs the latch output as the digital pixel value Dpv, the later stage n-bit latch 53b corresponding to a column on one terminal side. Thereafter, the digital pixel value Dpv is processed in various image processing and a color image signal is obtained.

The controlling section 6 includes: a ramp waveform signal generating circuit 61 for generating and outputting a ramp waveform signal 61a (triangle wave signal), as a reference signal, to the comparator 52; and an n-bit counter 62 for outputting a digital value, including successively-increasing count value, to the preceding stage n-bit latch 53a. The controlling section 6 temporarily stores a digital value from the n-bit counter 62 when signal levels of the analog pixel signal DApv and the reference signal match each other, at the preceding stage n-bit latch 53a. The ramp waveform signal generating circuit 61 and n-bit counter 62 are reset repeatedly at every predetermined time period, and a start of an increase in a signal level of the ramp waveform signal 61a and a start of an increase in a digital value from the n-bit counter 62 are synchronized by a reference clock CK or its reverse clock CKB.

The controlling section 6 further includes a duty adjusting circuit 63 and a control signal generating circuit 64. The duty adjusting circuit 63 accurately adjusts a predetermined duty ratio of a reverse clock signal CKB with respect to the reference clock CK (50 percent at high level/50 percent at low level, herein). The control signal generating circuit 64 generates a control signal for enabling to select and control either of two transistors used in the duty adjusting circuit 63 to dissolve a manufacture variation of the transistors and adjust the predetermined duty ratio accurately.

The n-bit counter 62 is a gray code counter (gray code generating circuit).

In Embodiment 1, a binary counter (n-bit counter 62) is included for producing a successively-increasing digital value from the reverse clock signal CKB with respect to the reference clock CK. From the binary counter (n-bit counter 62), a count value from the most significant bit to the second least significant bit of a digital value is generated as a gray code, and a gray code generated from a reverse clock CKB of a reference clock CK is applied for the least significant bit of the digital value, so that the number of bits is increased by one bit without increasing a reference clock frequency compared to a conventional counter constituted of a normal gray code, thereby increasing a resolution of an A/D conversion. The binary counter is used to generate a count value of the most significant bit to the second least significant bit, but another circuit performing a similar code output may also be used. In addition, each flip flop illustrated in each figure is of a clock synchronizing type, and a reset function may be added for resetting an output code.

Hereinafter, the n-bit counter 62 (gray code generating circuit), duty adjusting circuit 63 and control signal generating circuit 64 will be described in detail.

Figure 3:
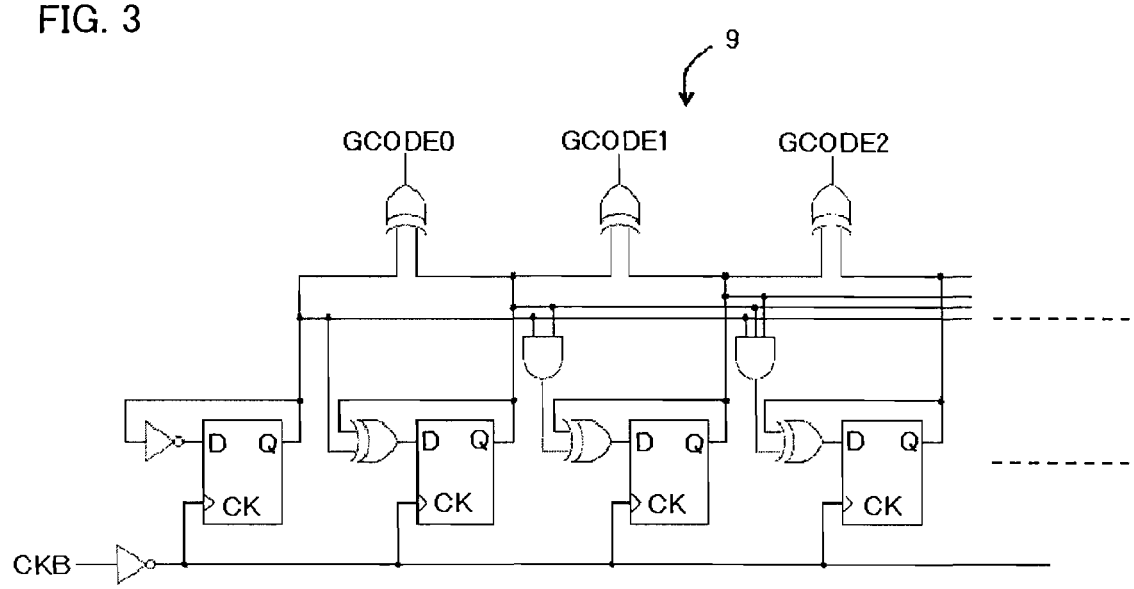
FIG. 3 is a circuit diagram illustrating an exemplary conventional gray code producing circuit.

First, FIG. 3 illustrates an example of a conventional gray code producing circuit. As illustrated in FIG. 3, a conventional gray code producing circuit 9 can generate a gray code with a combination of a plurality of flip flop circuits and a simple logic circuit. Herein, three bit codes CGODE0 to 2 are generated as a count value.

Figure 4:
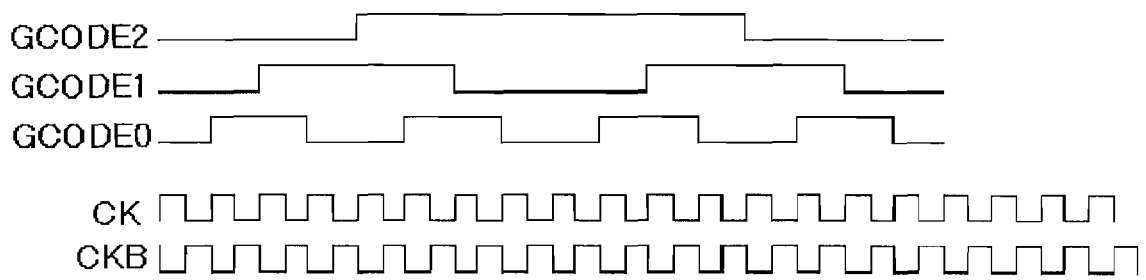
FIG. 4 is a diagram illustrating a timing diagram of a gray code produced by a conventional gray code producing circuit in FIG. 3.

FIG. 4 is a diagram illustrating a timing diagram of a gray code produced by the conventional gray code producing circuit 9.

As illustrated in FIG. 4, the least significant bit of the gray code (CGODE0) has a frequency one-fourth of a frequency of a reverse clock CKB with respect to a reference clock CK.

Figure 5:
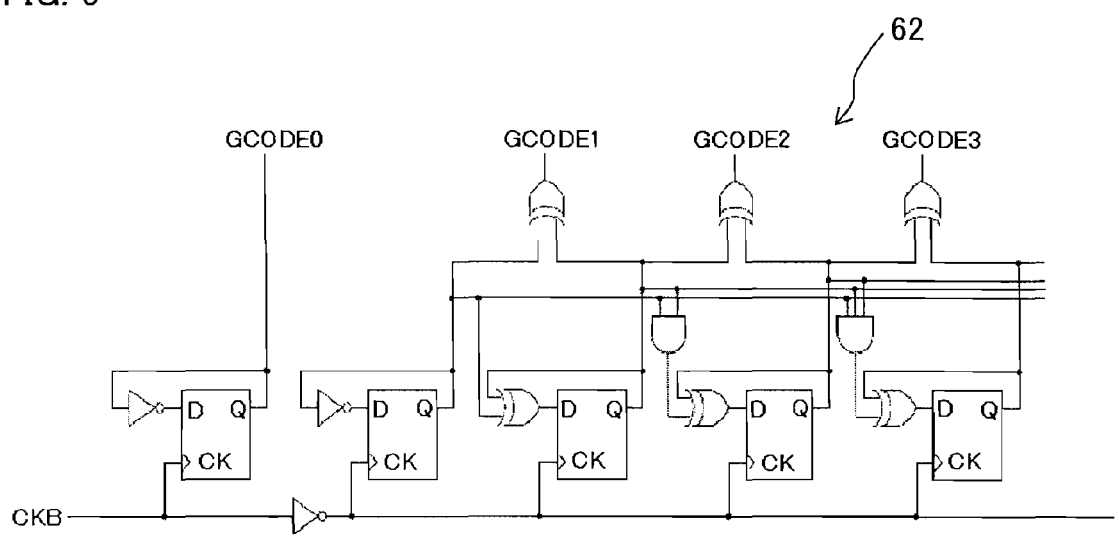
FIG. 5 is a circuit diagram illustrating a specific example of a gray code generating circuit used in a solid-state image capturing apparatus according to Embodiment 1 of the present invention.
Figure 6:
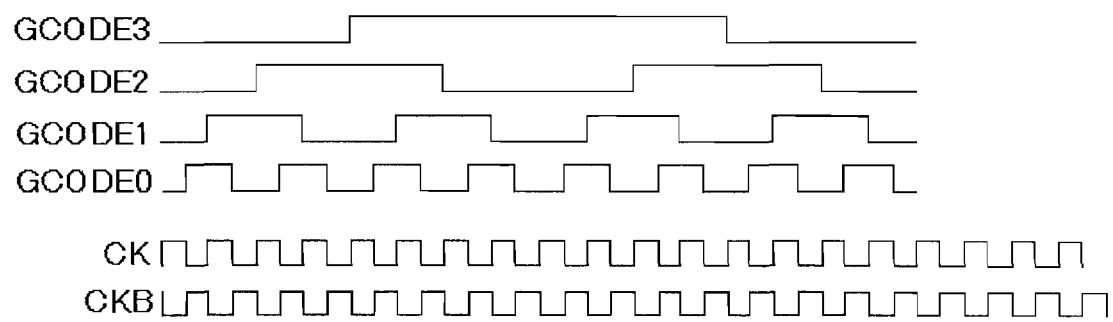
FIG. 6 is a diagram illustrating a timing diagram of a gray code generated by a gray code generating circuit in FIG. 5.

FIG. 5 is a circuit diagram illustrating a specific example of a gray code generating circuit used in the solid-state image capturing apparatus 1 according to Embodiment 1 of the present invention. FIG. 6 is a diagram illustrating a timing diagram of a gray code generated by a gray code generating circuit in FIG. 5.

As illustrated in FIGS. 5 and 6, the n-bit counter 62 according to Embodiment 1 constitutes the gray code generating circuit, and uses a gray code, in which a count value of a gray code counter is the most significant bit to the second least significant bit of a digital value, and the least significant bit of the digital value is generated from the reference clock CK or its reverse clock CKB to be defined as the least significant bit of the gray code counter.

In this case, as similar to the case of the conventional gray code producing circuit 9 in FIG. 3, an output section of the n-bit counter 62 (gray code generating circuit) from the most significant bit to the second least significant bit of a digital value is constituted of a plurality of flip flop circuits and a simple logic circuit. The difference is as follows with regard to an output section of the n-bit counter 62 (gray code generating circuit) of the least significant bit of the digital value: the reference clock CK or its reverse clock CKB is input into a clock input terminal of a data flip flop, and data of the least significant bit (least significant bit GCODE0) is output from a data output terminal Q of the data flip flop, and the data output terminal Q is connected to a data input terminal D with an inverter INV interposed therebetween. As described above, the least significant bit of the digital value can be generated from the reference clock or its reverse clock to be defined as the least significant bit of the gray code counter.

According to Embodiment 1 as described above, the least significant bit (GCODE0) of the gray code is newly added and the frequency of the least significant bit (GCODE0) is a frequency one-half of a frequency of the reverse clock CKB with respect to the reference clock CK. As a result, it is possible to increase the bit length of the gray code by one bit without doubling a frequency of the reference clock CK in Embodiment 1. Thereby, it is possible to increase a resolution of an A/D conversion without increasing a chip occupying area or power consumption of the n-bit counter 62 (a gray code generating circuit or a binary counter).

Figure 7:
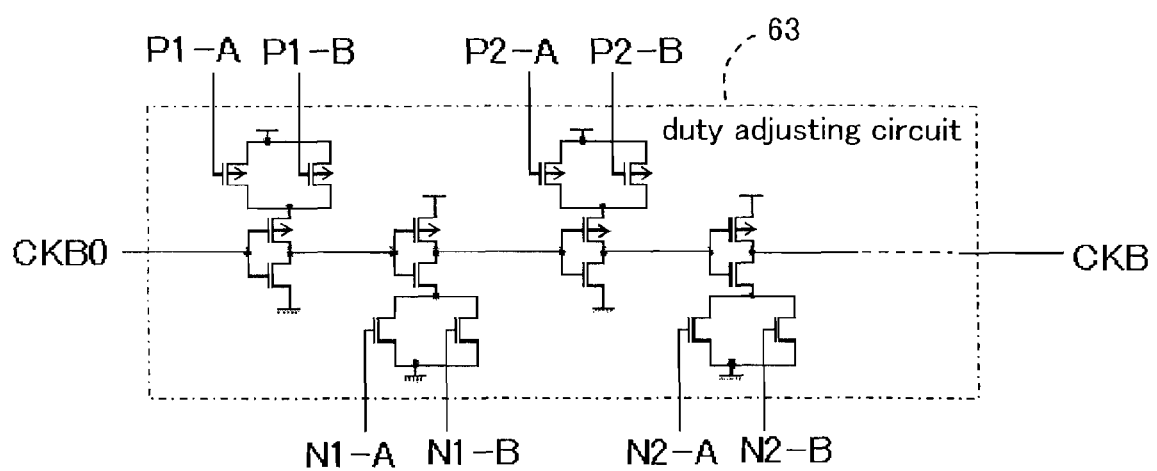
FIG. 7 is a circuit diagram illustrating a specific example of the duty adjusting circuit in FIG. 2.
Figure 8:
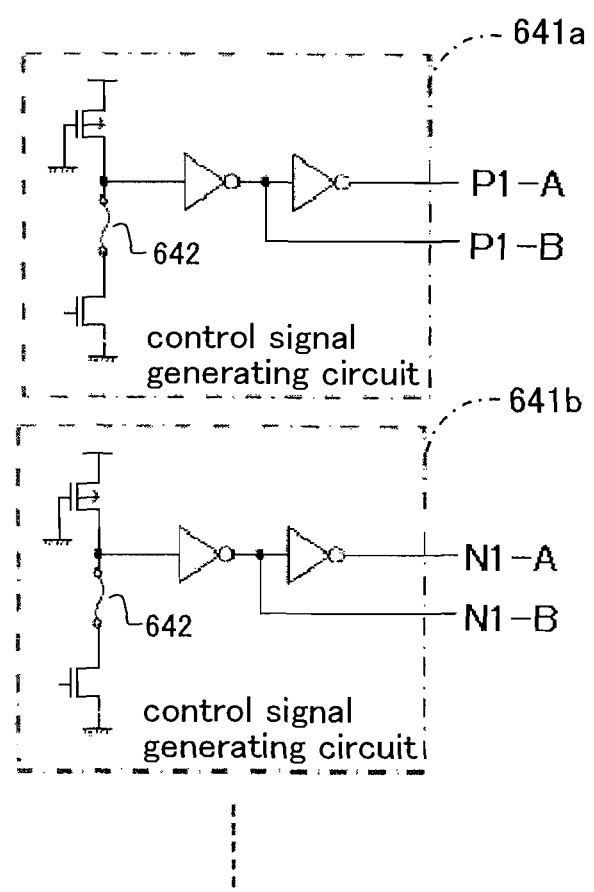
FIG. 8 is a circuit diagram illustrating a specific example of a control signal generating circuit for generating control signals P1-A, P1-B, N1-A and N1-B, which are supplied to a duty adjusting circuit in FIG. 7.

FIG. 7 is a circuit diagram illustrating a specific example of the duty adjusting circuit 63 in FIG. 2. FIG. 8 is a circuit diagram illustrating a specific example of the control signal generating circuit 64 for generating control signals P1-A, P1-B, N1-A and N1-B, which are supplied to the duty adjusting circuit 63 in FIG. 7.

The controlling section 6 of the A/D conversion section 4 further includes: the duty adjusting circuit 63 in FIG. 7 capable of adjusting a duty ratio of the reference clock or its reverse clock using the control signals P1-A, P1-B, N1-A and N1-B; and control signal generating circuits 641a and 641b in FIG. 8 for outputting the control signals P1-A, P1-B, N1-A and N1-B. The controlling of duty adjustment of the duty adjusting circuit 63 is performed by switching the control signals P1-A, P1-B, N1-A and N1-B in accordance with a connection or a disconnection of a fuse 642, which is electrically or physically disconnectable. The fuse 642 is provided for both the control signal generating circuits 641a and 641b.

That is, whether or not the fuse 642 is disconnected or not determines grounding inside the control signal generating circuits 641a and 641b. In that case, either of the control signal P1-A or P1-B of the control signal generating circuit 641a is at a high level and the other is at a low level. In addition, either of the control signal N1-A or N1-B of the control signal generating circuit 641b is at a high level and the other is at a low level. As a result, it is possible to select and control to drive either one of the two transistors of the duty adjusting circuit 63 in FIG. 7. Thereby it is possible to adjust a duty ratio due to a manufacture variation of the transistors and accurately adjust a predetermined duty ratio of the reverse clock signal CKB. By the accurate adjustment of the predetermined duty ratio, a more accurate color gradient can be attained, and the number of bits can be increased for the gray code used in an A/D conversion to perform image capturing with a higher color gradient.

Figure 9:
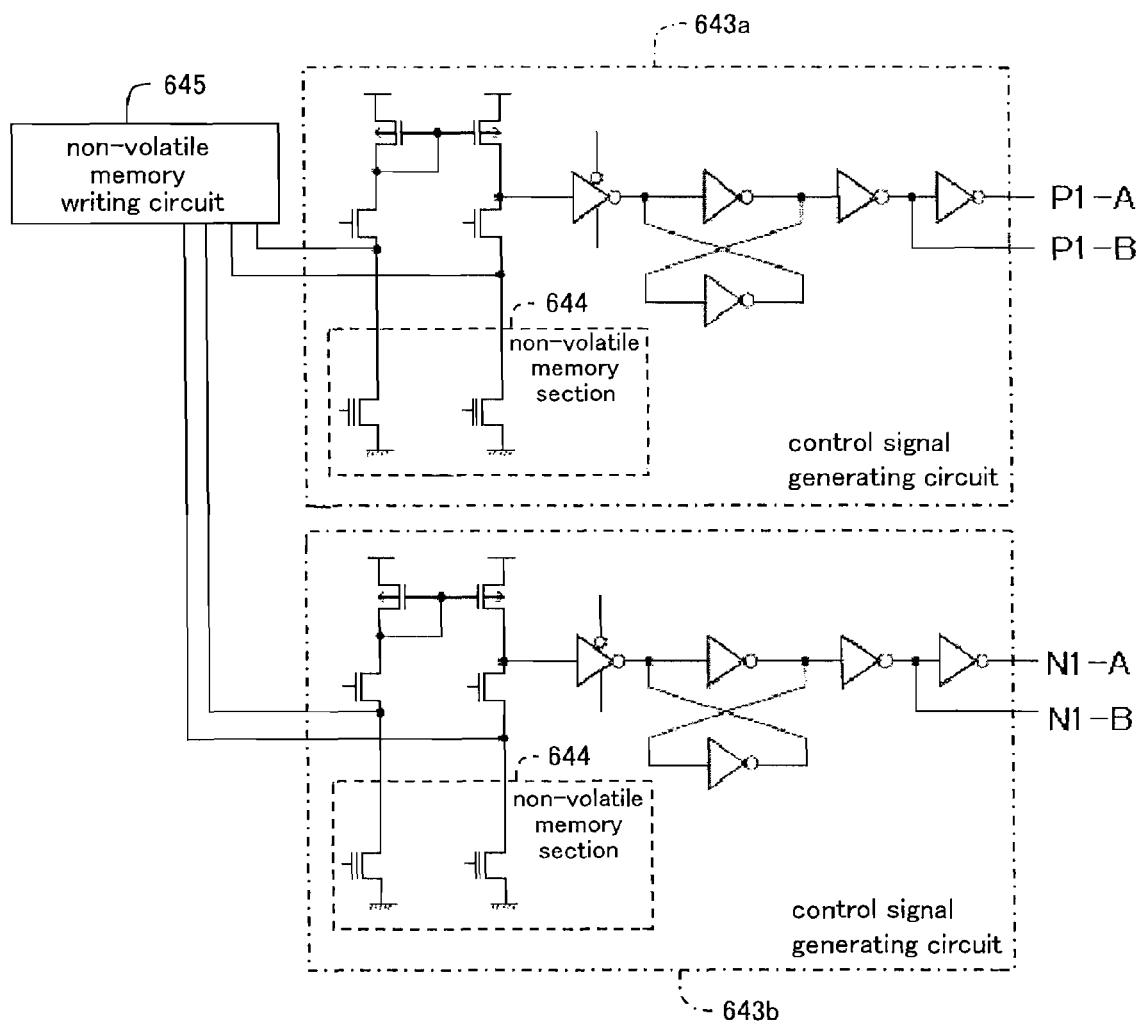
FIG. 9 is a circuit diagram illustrating another specific example of a control signal generating circuit for generating control signals P1-A, P1-B, N1-A and N1-B, which are supplied to a duty adjusting circuit in FIG. 7.

Next, without the limitation to the above configuration, the controlling section 6 of the A/D conversion section 4 may include the duty adjusting circuit 63 in FIG. 7, which is capable of adjusting a duty ratio of a reference clock or its reverse clock using a control signal, and control signal generating circuits 643a and 643b in FIG. 9 for outputting the control signal. Further, the controlling of duty adjustment of the duty adjusting circuit 63 may be performed by switching the control signals P1-A, P1-B, N1-A and N1-B depending on whether or not a non-volatile memory section 644 is thus programmed, the non-volatile memory section 644 being provided for each of the control signal generating circuits 643a and 643b. In this case, the non-volatile memory section 644 can write data onto any memory cell by a non-volatile memory writing circuit 645.

That is, by programming either non-volatile memory section 644, an output polarity operation is determined for the control signal generating circuits 643a and 643b. In that case, either of the control signal P1-A or P1-B of the control signal generating circuit 643a is at a high level and the other is at a low level. In addition, either of the control signal N1-A or N1-B of the control signal generating circuit 643b is at a high level and the other is at a low level. As a result, it is possible to select and control to drive either one of the two transistors of the duty adjusting circuit 63 in FIG. 7. Thereby it is possible to adjust a duty ratio due to a manufacture variation of the transistors and accurately adjust a predetermined duty ratio of the reverse clock signal CKB. By the accurate adjustment of the predetermined duty ratio, a more accurate color gradient can be attained, and the number of bits can be increased for the gray code used in an A/D conversion to perform image capturing with a higher color gradient.

Figure 10:
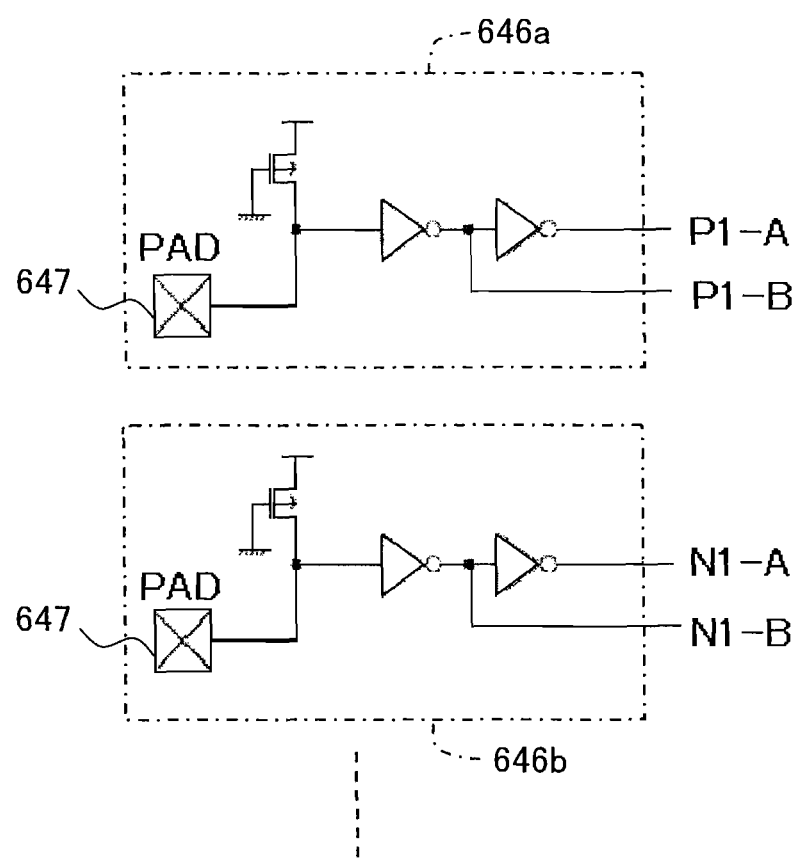
FIG. 10 is a circuit diagram illustrating still another specific example of a control signal generating circuit for generating control signals P1-A, P1-B, N1-A and N1-B, which are supplied to a duty adjusting circuit in FIG. 7.

In addition, without the limitation to the above configuration, the controlling section 6 of the A/D conversion section 4 further includes the duty adjusting circuit 63 in FIG. 7, which is capable of adjusting a duty ratio of a reference clock or its reverse clock using a control signal, and control signal generating circuits 646a and 646b in FIG. 10 for outputting the control signal. Further, the controlling of duty adjustment of the duty adjusting circuit 63 is performed by switching the control signals P1-A, P1-B, N1-A and N1-B depending on whether or not a connection of a wire exists to a pad (PAD) 647, the pad 647 being capable of wire bonding.

That is, whether or not grounding is made is determined from the pad (PAD) 647, which is capable of wire bonding, through a wire. Based on this, either of the control signal P1-A or P1-B of the control signal generating circuit 646a is at a high level and the other is at a low level, and either of the control signal N1-A or N1-B of the control signal generating circuit 646b is at a high level and the other is at a low level. Thereby, it is possible to select and control to drive either one of the two transistors of the duty adjusting circuit 63 in FIG. 7. Thereby it is possible to adjust a duty ratio due to a manufacture variation of the transistors and accurately adjust a predetermined duty ratio of the reverse clock signal CKB. By the accurate adjustment of the predetermined duty ratio, a more accurate color gradient can be attained, and the number of bits can be increased for the gray code used in an A/D conversion to perform image capturing with a higher color gradient.

According to Embodiment 1 with the configuration described above, in the A/D conversion section 4, in which the comparator 52 compares a ramp waveform signal 61a, as a reference signal, from the ramp waveform signal generating circuit 61 with an analog pixel signal for each column, and outputs, to the preceding stage n-bit latch 53a, a digital pixel value Dpv, as a corresponding digital value, when both signals match each other. In the A/D conversion section 4, the gray code is used, in which a gray code value, produced on the basis of a count value generated from a binary counter of the n-bit counter 62 from the most significant bit to the second least significant bit of the digital value, is output as a count value of the gray code counter, and the least significant bit of the digital value is defined as the least significant bit of the gray code counter generated from the reference clock CK or its reverse clock CKB. As a result, a resolution of an A/D conversion can be increased by one bit, thereby increasing the number of bits of the gray code used for an A/D conversion and performing image capturing with a higher color gradient without an increase in the reference clock frequency. As a result, even if a resolution of contrast is increased, it is possible to suppress the increase in area occupancy by the gray code counter and the increase in power consumption in the gray counter.

Embodiment 2

In Embodiment 1, the case with the use of a gray code has been described where the most significant bit to the second least significant bit are generated as a count value from a gray code counter (n-bit counter 62), and the least significant bit is constituted of the least significant bit of a binary counter (n-bit counter 62) generated from a reverse clock of a reference clock, so that a resolution of an A/D conversion is increased by one bit. In Embodiment 2, another case with the use of a gray code will be described where: the most significant bit to the third least significant bit are generated as a count value from a gray code counter (n-bit counter 62A); the second least significant bit is defined as the second least significant bit from a binary counter (n-bit counter 62A) generated from a reverse clock of a reference clock; and a signal of the same period with a reference clock CK or a reverse clock CKB obtained by deviating one-fourth of a phase of a reference clock CK or its reverse clock CKB by a signal generating circuit (delay circuit, herein) is defined as the least significant bit of a gray code counter (n-bit counter 62A), so that a resolution of an A/D conversion can be increased by two bits.

Figure 11:
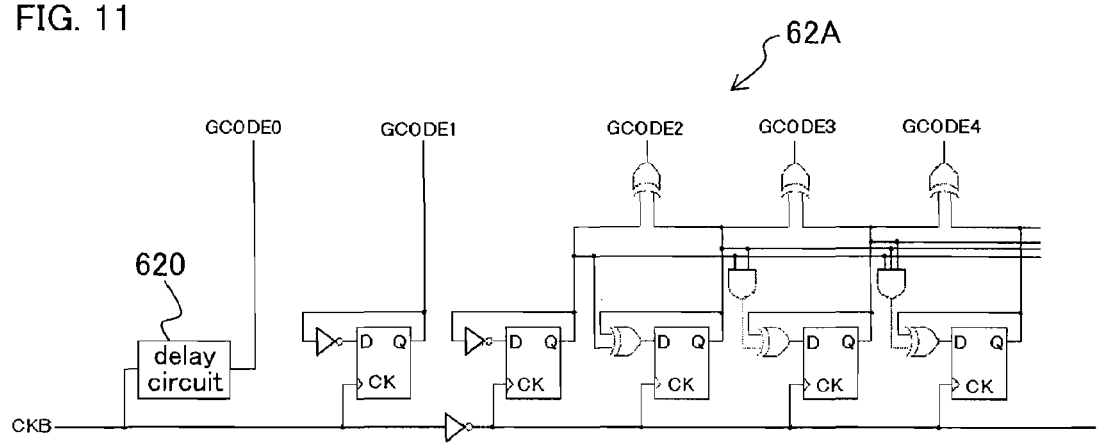
FIG. 11 is a circuit diagram illustrating a specific example of a gray code generating circuit used in a solid-state image capturing apparatus according to Embodiment 2 of the present invention.
Figure 12:
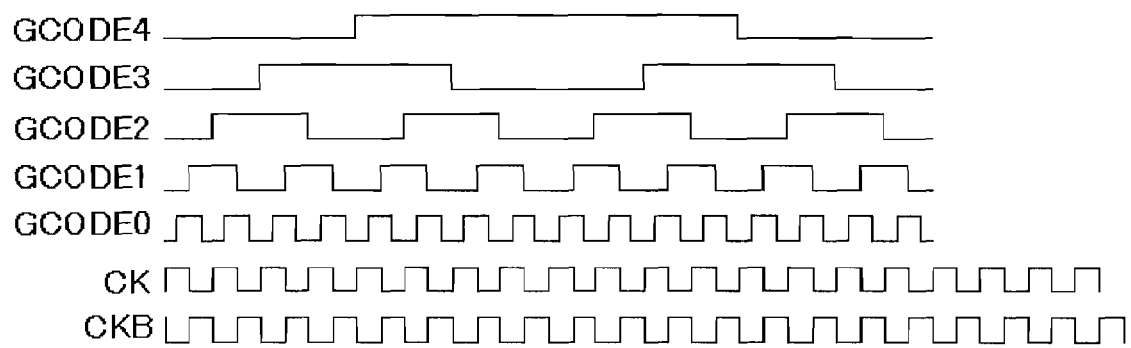
FIG. 12 is a diagram illustrating a timing diagram of a gray code generated by a gray code generating circuit in FIG. 11.

FIG. 11 is a circuit diagram illustrating a specific example of a gray code generating circuit used in a solid-state image capturing apparatus 1A according to Embodiment 2 of the present invention. FIG. 12 is a diagram illustrating a timing diagram of a gray code generated by a gray code generating circuit (n-bit counter 62A) in FIG. 11.

As illustrated in FIGS. 11 and 12, an n-bit counter 62A according to Embodiment 2 constitutes a gray code generating circuit, and uses a gray code, in which a count value of the most significant bit to the third least significant bit of a digital value is generated from a gray code counter generated from a binary counter and a logic circuit; the second least significant bit of the digital value is defined as the second least significant bit of the gray code counter generated from a reference clock CK or its reverse clock CKB; and the least significant bit of the digital counter is defined as the least significant bit of the gray code counter, which is a signal of the same period with a reference clock CK or its reverse clock CKB obtained by deviating one-fourth of a phase of the reference clock CK or its reverse clock CKB.

In this case, an output section of the n-bit counter 62A (gray code generating circuit) from the most significant bit to the third least significant bit of the digital value is constituted of a plurality of flip flop circuits and a simple logic circuit, as similar to the case of the conventional gray code producing circuit 9 in FIG. 3. In an output section of the second least significant bit of the digital value, as similar to the case of the least significant bit of a digital value of the gray code producing circuit in FIG. 5, the reference clock CK or its reverse clock CKB is input into a clock input terminal of a data flip flop; data of the least significant bit (second least significant bit GCODE1) is output from a data output terminal Q of the data flip flop, and the data output terminal Q is connected to a data input terminal D. As described above, the second least significant bit of the digital value can be generated from the reference clock or its reverse clock to be the second least significant bit of the gray code counter. The difference with the case of the gray code producing circuit in FIG. 5 is that the output section of the least significant bit of the digital value is constituted of a signal generating circuit, such as a delay circuit 620 for generating a signal obtained by deviating one-fourth of a phase of a reference clock CK or its reverse clock CKB. As described above, the least significant bit of the digital value can be defined as the least significant bit of the gray code counter based on a signal with the same period as a reference clock or its reverse clock obtained by deviating one-fourth of a phase of a reference clock or its reverse clock.

That is, the difference with the case of the conventional gray code producing circuit 9 in FIG. 3, the aforementioned least significant bit (GCODE0) and the second least significant bit (GCODE1) of the gray code are newly added; the signal of the same period with a reference clock obtained by deviating one-fourth of a phase of a reference clock by the delay circuit 620 is defined as the least significant bit (GCODE0); and the frequency of the least significant bit (GCODE0) of the gray code is the same frequency of the reference clock CK or its reverse clock CKB. A binary counter is used to produce a count value of the most significant bit to the third least significant bit of the n-bit counter 62A; however, it is also possible to use a different circuit that performs a similar code output. In addition, each flip flop illustrated in the figures is a clock synchronizing type, and a reset function may be added for resetting an output code.

In Embodiment 2 with the configuration described above, it is possible to increase one more bit for the bit length of the gray code to be 2 bits in total, by using the delay circuit 620, as a signal generating circuit for generating a signal with a phase of a reference clock CK or its reverse clock CKB deviated by one-fourth, without increasing the frequency of the reverse clock CKB reversed with respect to the reference clock CK. Thereby, it is possible to increase a resolution of an A/D conversion without increasing a chip occupying area or power consumption of the gray code generating circuit (n-bit counter 62A).

Whereas, in Embodiment 1, a resolution of an A/D conversion is increased by one bit without raising a frequency of the reference clock CK, it is possible, in Embodiment 2, to increase a resolution of an A/D conversion by one more bit for the total of two bits by using the delay circuit 620 as illustrated in FIG. 11.

The GCODE4 to 1 in FIG. 11 are generated in the same manner as that described in Embodiment 1 with reference to FIG. 5. The least significant bit (GCODE0) of the gray code can be generated as the least significant bit signal based on a signal of the same period as the signal with a phase of the reverse clock CKB deviated by one-fourth, with a reverse signal CKB of the reference clock CK through a delay circuit 621 as illustrated in FIG. 13.

The delay circuit 621 is constituted of an inverter chain circuit, for example. The delay circuit 621, which is constituted of an inverter chain circuit, is constituted of two delay circuits A and B and a three NAND gate logic circuit, where it is difficult to accurately design a phase due to variation of transistor characteristics. Thus, in order to solve manufacture variation of the transistors used for the delay circuit 621 and adjust a phase of an output signal from the delay circuit 621 in FIG. 13, a control signal generating circuit is illustrated in FIGS. 14 to 16, the control signal generating circuit generating control signals SELA and SELB to select and control either of one delay circuit A or two of the delay circuits A and B (A+B).

Figure 13:
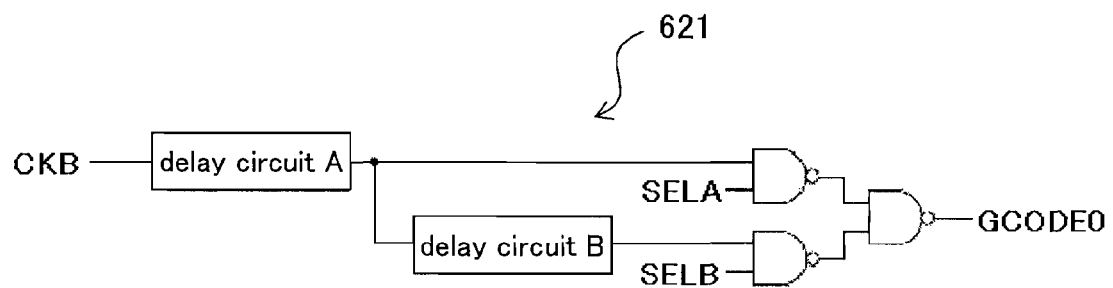
FIG. 13 is a circuit diagram illustrating a specific example of a delay circuit constituting a gray code generating circuit in FIG. 11.

The delay circuit 621 in FIG. 13 includes: a first delay circuit A, into which a reference clock CK or its reverse clock CKB is input; a second delay circuit B, into which output data of the first delay circuit A is input; a logic circuit (three NAND gate circuit, herein), into which each output data of the first delay circuit A and the second delay circuit B is input, and which is capable of switching a delay by the first delay circuit A and a delay by the second delay circuit B by using control signals SELA and SELB.

Figure 14:
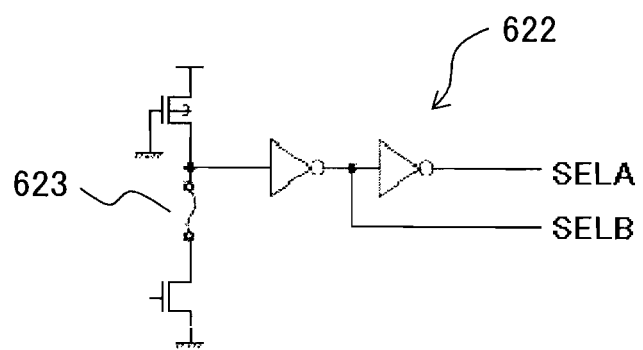
FIG. 14 is a circuit diagram illustrating a specific example of a control signal generating circuit for generating control signals SELA and SELB for adjusting a phase of an output signal from a delay circuit in FIG. 13.
Figure 15:
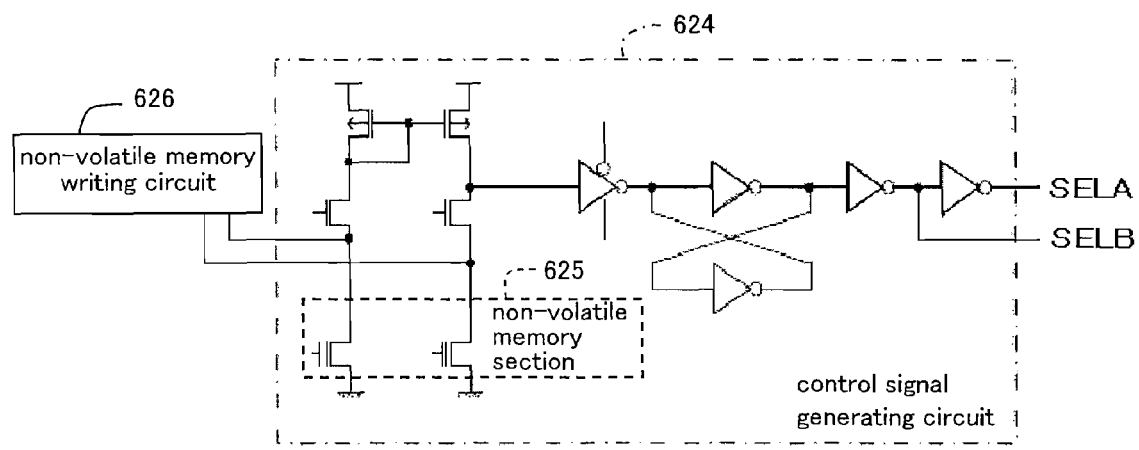
FIG. 15 is a circuit diagram illustrating another specific example of a control signal generating circuit for generating control signals SELA and SELB for adjusting a phase of an output signal from a delay circuit in FIG. 13.
Figure 16:
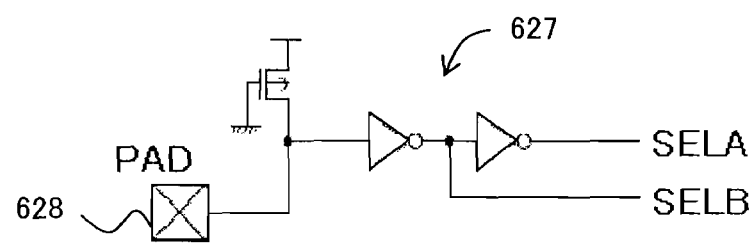
FIG. 16 is a circuit diagram illustrating still another specific example of a control signal generating circuit for generating control signals SELA and SELB for adjusting a phase of an output signal from a delay circuit in FIG. 13.

FIGS. 14 to 16 are each a circuit diagram illustrating a specific example of a control signal generating circuit for generating control signals SELA and SELB for adjusting a phase of an output signal from the delay circuit 621 in FIG. 13.

The n-bit counter 62A (gray code generating circuit) in FIG. 11 in the controlling section 6A of the A/D conversion section 4A in FIG. 2, is provided with the delay circuit 620 of FIG. 11 for an output section of the least significant bit (GCODE0), the delay circuit 620 including the delay circuit 621 in FIG. 13 and the control signal generating circuit 622 in FIG. 14 for controlling the delay circuit 621. The delay controlling of the delay circuit 621 in FIG. 13 is performed by switching the control signals SELA and SELB in accordance with a connection or a disconnection of an electrically or physically disconnectable fuse 623, which is provided in the control signal generating circuit 622 in FIG. 14. The delay circuit 620 in FIG. 11 is constituted of the delay circuit 621 in FIG. 13 and the control signal generating circuit 622 in FIG. 14.

That is, whether or not the fuse 623 is disconnected or not determines grounding inside the control signal generating circuit 622 in FIG. 14. In that case, either of the control signal SELA or SELB of the control signal generating circuit 622 in FIG. 14 is at a high level and the other is at a low level, or is switched to their reverse level. Thereby, the phase of the output least significant bit (GCODE0) of the delay circuit 621 in FIG. 13 can be controlled to be adjusted. As a result, the phase of the reverse clock CKB can be accurately adjusted.

Next, without the limitation to the above configuration, in the n-bit counter 62A (gray code generating circuit) in FIG. 11 in the controlling section 6A of the A/D conversion section 4A in FIG. 2, the delay circuit 620 in FIG. 11 includes the delay circuit 621 in FIG. 13, and a control signal generating circuit 624 in FIG. 15 for controlling the delay circuit 621. The delay controlling of the delay circuit 621 is performed by switching a signal level of the control signals SELA and SELB in accordance with the presence or absence of a program for a non-volatile memory section 625 provided in the control signal generating circuit 624 in FIG. 15. The non-volatile memory section 625 can set one of the control signals SELA and SELB at a high level and the other at a low level by the writing of predetermined data into either of the two memories in the non-volatile memory section 625 by a non-volatile memory writing circuit 626.

That is, an output polarity operation of the control signal generating circuit 624 in FIG. 15 is determined on the basis of whether one of the two memories in the non-volatile memory section 625 contains a program and the other does not. As a result, either one of the control signal SELA or SELB of the control signal generating circuit 624 in FIG. 15 is set to be at a high level and the other at a low level, or is switched to their reverse level. Thereby, the phase of the output least significant bit (GCODE0) of the delay circuit 621 in FIG. 13 can be controlled to be adjusted. As a result, the phase of the reverse clock CKB can be accurately adjusted.

In addition, without the limitation to the above configuration, in the n-bit counter 62A (gray code generating circuit) in FIG. 11 in the controlling section 6A of the A/D conversion section 4A in FIG. 2, the delay circuit 620 in FIG. 11 includes the delay circuit 621 and a control signal generating circuit 627 in FIG. 15 for controlling the delay circuit 621. The delay controlling of the delay circuit 621 is performed by switching a signal level of the control signals SELA and SELB in accordance with whether or not wire bonding by a wire is performed or not through a pad 628 (PAD), capable of wire bonding, provided in the control signal generating circuit 627.

That is, it is determined whether or not grounding is performed or not by wire bonding through the pad 628 (PAD), which is capable of wire bonding. Accordingly, either of the control signal SELA or SELB of the control signal generating circuit 627 is set to be at a high level and the other is set to be at a low level, or is switched to their reverse level. Thereby, the phase of the output least significant bit (GCODE0) of the delay circuit 621 in FIG. 13 can be controlled to be adjusted. As a result, the phase of the reverse clock CKB can be accurately adjusted.

According to Embodiment 2 with the configuration as described above, in the A/D conversion section 4 for outputting a corresponding digital pixel value Dpv when the ramp waveform signal 61a, as a reference signal, from the ramp waveform signal generating circuit 61 is compared with the analog pixel signal for each column and they match each other, it is defined that a count value of the most significant bit to the third least significant bit of the digital pixel value Dpv is a gray code counter value generated from the binary counter and the logic circuit. The second least significant bit of the digital pixel value Dpv is defined as the second least significant bit of the gray code counter generated from the flip flop circuit, which takes the reverse clock of the reference clock as an input. The least significant bit of the digital pixel value Dpv is defined as the least significant bit based on a signal of the same period as a clock obtained by deviating one-fourth of a phase of the reference clock CK or its reverse clock CKB. By using these gray codes, a resolution of an A/D conversion can be increased by two bits, thereby increasing the number of bits of the gray code used for an A/D conversion and performing image capturing with a higher color gradient without an increase in the reference clock. Thus, even if a resolution of contrast is increased, it is possible to control the increase in area occupancy by the gray code counter and the increase in power consumption in the gray counter.

Embodiment 3

Figure 17:
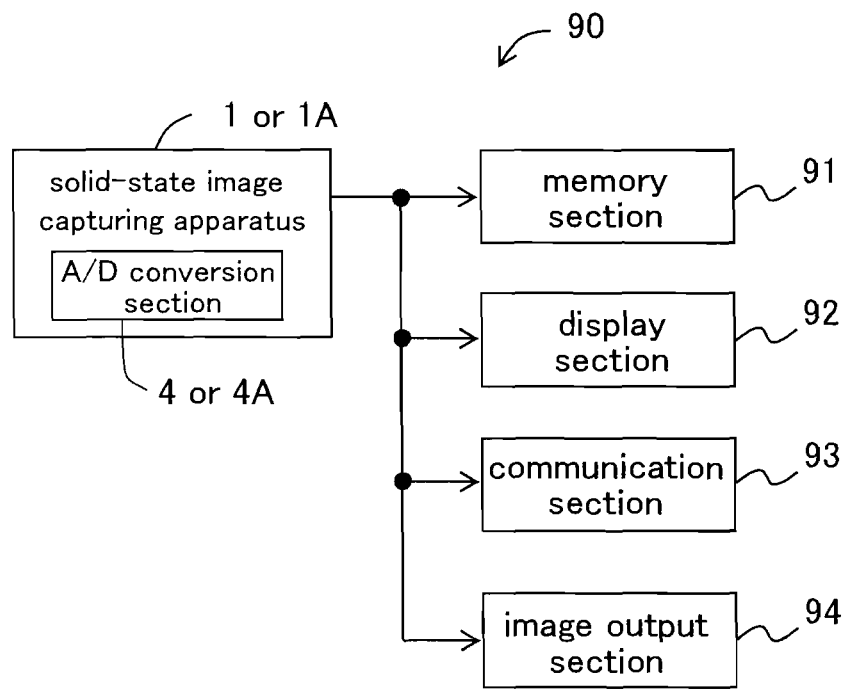
FIG. 17 is a block diagram schematically illustrating an exemplary configuration of an electronic information device, as Embodiment 3 of the present invention, using a solid-state image capturing apparatus according to either of Embodiment 1 or 2 of the present invention, as an image input device in an image capturing section.
Figure 18:
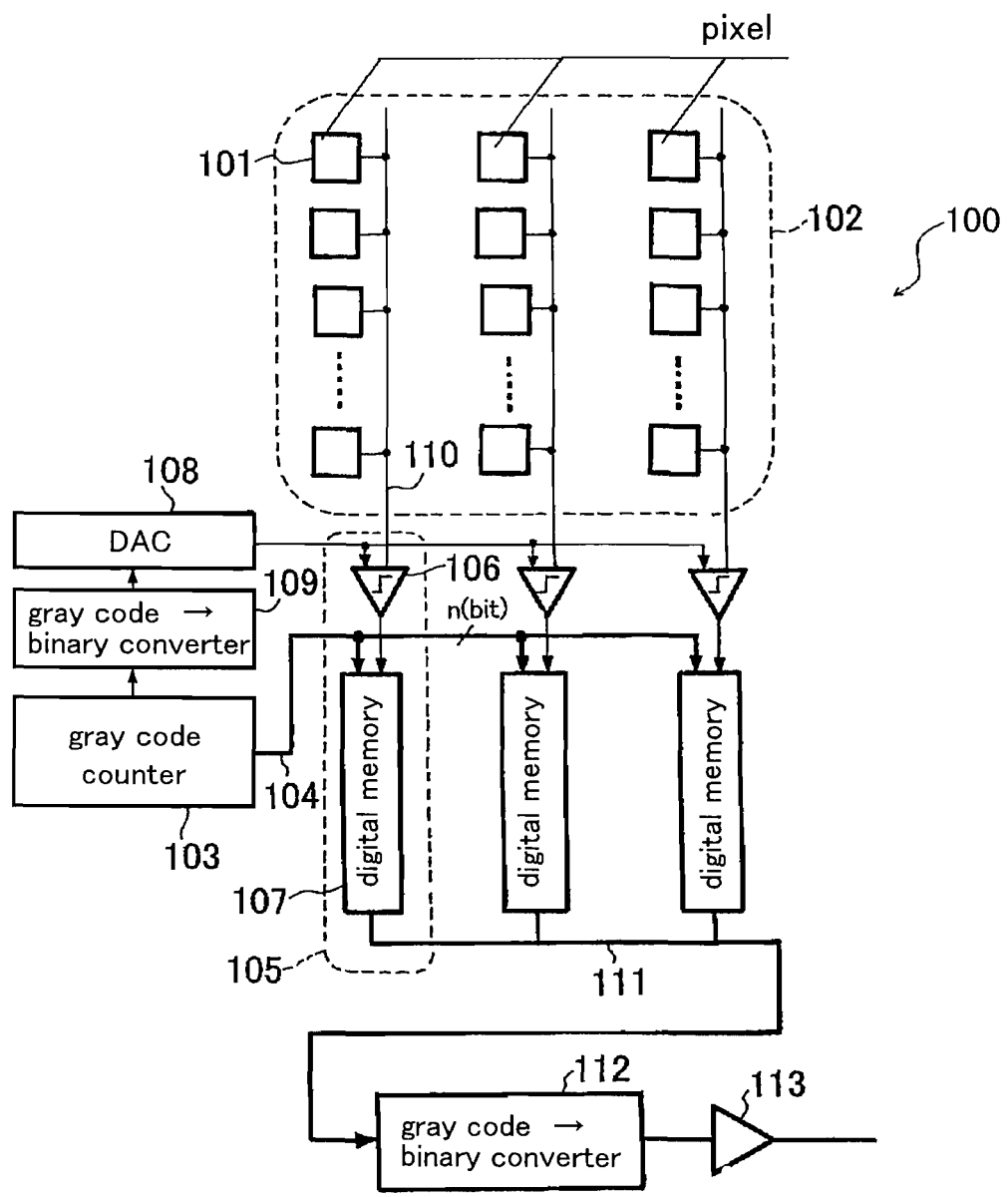
FIG. 18 is a block diagram illustrating an exemplary configuration of essential parts of a conventional solid-state image capturing apparatus disclosed in Reference 1.

FIG. 17 is a block diagram schematically illustrating an exemplary configuration of an electronic information device, as Embodiment 3 of the present invention, using a solid-state image capturing apparatus 1 or 1A including an A/D conversion section 4 or 4A according to either of Embodiment 1 or 2 of the present invention, as an image input device in an image capturing section.

In FIG. 17, an electronic information device 90 according to Embodiment 3 of the present invention includes: a solid-state image capturing apparatus 1 or 1A, including an A/D conversion section 4 or 4A according to Embodiment 1 or 2; a memory section 91 (e.g., recording media) for data-recording a color image signal from the solid-state image capturing apparatus 1 or 1A after a predetermined signal process is performed on the color image signal for recording; a display section 92 (e.g., a liquid crystal display apparatus) for displaying the color image signal from the solid-state image capturing apparatus 1 or 1A on a display screen (e.g., liquid crystal display screen) after predetermined signal processing is performed on the color image signal for display; a communication section 93 (e.g., a transmitting and receiving device) for communicating the color image signal from the solid-state image capturing apparatus 1 or 1A after predetermined signal processing is performed on the color image signal for communication; and an image output section 94 (e.g., a printer) for printing the color image signal from the solid-state image capturing apparatus 1 or 1A after predetermined signal processing is performed for printing. Without any limitations to this, the electronic information device 90 may include any of the memory section 91, the display section 92, the communication section 93, and the image output section 94, other than the solid-state image capturing apparatus 1 or 1A.

As the electronic information device 90, an electronic device that includes an image input device is conceivable, as described previously, such as a digital camera (e.g., digital video camera or digital still camera), an image input camera (e.g., a monitoring camera, a door phone camera, a camera equipped in a vehicle including a car mounted back view monitoring camera, or a television camera), a scanner, a facsimile machine, a camera-equipped cell phone device or a personal digital assistant (PDA).

Therefore, according to Embodiment 3 of the present invention, the color image signal from the solid-state image capturing apparatus 1 or 1A can be: displayed on a display screen properly, printed out properly on a sheet of paper using an image output section 94, communicated properly as communication data via a wire or a radio; stored properly at the memory section 91 by performing predetermined data compression processing; and various data processes can be properly performed.

A reference clock CK or its reverse clock CKB is input into a clock input terminal of a data flip flop, data of the least significant bit (least significant code GCODE0) is output from a data output terminal Q of the data flip flop, and the data output terminal Q is connected to a data input terminal D with an inverter INV interposed therebetween. In Embodiment 1, the case has been described where a resolution of an A/D conversion is increased by one bit by using a gray code, the gray code configured such that the most significant bit to the second least significant bit of a digital value is generated as a count value of a counter, and the least significant bit of the digital value is the least significant bit of a gray code counter based on a data output from the data output terminal Q of the data flip flop generated from the reverse clock CKB of the reference clock CK. In Embodiment 2, the case has been described where a resolution of an A/D conversion is increased by two bits by using a gray code, the gray code configured such that the most significant bit to the third least significant bit of a digital value is generated as a count value of a counter; the second least significant bit of the digital value is the second least significant bit of the gray code counter based on a data output from the data output terminal Q of the data flip flop generated from the reverse clock CKB of the reference clock CK of the digital value; and the least significant bit of the digital value is the least significant bit of the gray code counter based on a signal of the same period with a clock obtained by deviating one-fourth of a phase of the reverse clock CKB of the reference clock CK. However, without the limitation to this, the reference clock CK may be used instead of the reverse clock CKB.

As a result, with respect to Embodiment 1, the gray code is used, in which the most significant bit to the second least significant bit of a digital value is generated as a count value of a counter, and the least significant bit is configured by a data output from the data output terminal Q of the data flip flop generated from the reference clock, thereby increasing a resolution of an A/D conversion by one bit. Further, with respect to Embodiment 2, the gray code is used, in which the most significant bit to the third least significant bit of a digital value is generated as a count value of a counter; the second least significant bit is configured by a data output from the data output terminal Q of the data flip flop generated from the reference clock; and the least significant bit is based on a signal of the same period with that of a clock obtained by deviating one-fourth of a phase of the reference clock, thereby increasing a resolution of an A/D conversion by two bits.

In addition, in Embodiment 2, it is possible to use the duty adjusting circuit 63 and the control signal generating circuit 64 (more particularly, the duty adjusting circuit 631 in FIG. 7 and the control signal generating circuit 641a, 641b, 643a, 643b, 646a and 646b in FIGS. 8 to 10) in FIG. 2 used in Embodiment 1. Further, the present invention is also effective in a case where the duty adjusting circuit 63 and the control signal generating circuit 64 in FIG. 2 are not used.

As described above, the present invention is exemplified by the use of its preferred Embodiments 1 to 3. However, the present invention should not be interpreted solely based on Embodiments 1 to 3 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 3 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of an A/D conversion apparatus for converting an analog signal to a digital signal; a solid-state image capturing apparatus, in which analog pixel signals (image capturing signals) from a plurality of semiconductor elements are A/D converted in a column parallel by the A/D conversion apparatus and are subsequently processed with various image processing to obtain color image signals, the semiconductor elements being for performing a photoelectric conversion on and capturing an image of incident light from a subject; and an electronic information device, such as a digital camera (e.g., a digital video camera or a digital still camera), an image input camera (e.g., a monitoring camera), a scanner, a facsimile machine, a television telephone device and a camera-equipped cell phone device, including the solid-state image capturing apparatus as an image input device used in an image capturing section thereof. According to the present invention, a resolution of an A/D conversion is increased by one or two bits, thereby increasing the number of bits of the gray code used for an A/D conversion and performing image capturing with a higher color gradient without an increase in the reference clock frequency. Thus, even if a resolution of contrast is increased, it is possible to suppress the increase in area occupancy by the gray code counter and the increase in power consumption in the gray counter.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An A/D conversion apparatus for comparing a reference signal with an analog signal, and when the reference signal matches with the analog signal, outputting a corresponding digital value,
wherein the A/D conversion apparatus includes a gray code counter for generating the digital value from a reference clock or a reverse clock of the reference clock, and uses a gray code,
wherein the digital value includes a count value of the gray code counter,
wherein the count value is a value defined as a most significant bit to a third least significant bit of the digital value; a second least significant bit of the digital value is generated from the reference clock or the reverse clock thereof and defined as a second least bit of the gray code counter; and a least significant bit of the digital value is configured with a signal of a same period as that of another reference clock or another reverse clock thereof obtained by deviating one-fourth of a phase of the reference clock or the reverse clock thereof.

2. An A/D conversion apparatus according to claim 1,
wherein the gray code counter includes an output section of the second least significant bit, and
wherein, in the output section, the reference clock or the reverse clock thereof is input into a clock input terminal of a flip flop, data of the second least significant bit is output from a data output terminal of the flip flop, and the data output terminal is connected to a data input terminal with an inverter interposed therebetween.

3. An A/D conversion apparatus according to claim 1, wherein an output section of the least significant bit of the gray code counter is constituted of a signal generating circuit for generating a signal obtained by deviating one-fourth of a phase of the reference clock or the reverse clock thereof.

4. An A/D conversion apparatus according to claim 1, further including a ramp waveform signal generating circuit for generating a ramp waveform signal as the reference signal.

5. An A/D conversion apparatus for comparing a reference signal with an analog signal, and when the reference signal matches with the analog signal, outputting a corresponding digital value,
wherein the A/D conversion apparatus includes a gray code counter for generating the digital value from a reference clock or a reverse clock of the reference clock, and uses a gray code,
wherein the digital value includes a count value of the gray code counter,
wherein the count value is a value defined as a most significant bit to a second least significant bit of the digital value and a least significant bit of the digital value is generated from the reference clock or the reverse clock thereof and defined as a least significant bit of the gray code counter,
wherein the A/D conversion apparatus further includes a duty adjusting circuit capable of adjusting a duty ratio of the reference clock or the reverse clock thereof using a control signal,
wherein duty adjustment of the duty adjusting circuit is controlled by switching the control signal in accordance with whether or not a fuse is disconnected, the fuse being electrically or physically disconnectable.

6. An A/D conversion apparatus according to claim 1, further including a duty adjusting circuit capable of adjusting a duty ratio of the reference clock or the reverse clock thereof using a control signal, wherein duty adjustment of the duty adjusting circuit is controlled by switching the control signal in accordance with whether or not a fuse is disconnected, the fuse being electrically or physically disconnectable.

7. An A/D conversion apparatus for comparing a reference signal with an analog signal, and when the reference signal matches with the analog signal, outputting a corresponding digital value,
wherein the A/D conversion apparatus includes a gray code counter for generating the digital value from a reference clock or a reverse clock of the reference clock, and uses a gray code,
wherein the digital value includes a count value of the gray code counter,
wherein the count value is a value defined as a most significant bit to a second least significant bit of the digital value and a least significant bit of the digital value is generated from the reference clock or the reverse clock thereof and defined as a least significant bit of the gray code counter,
wherein the A/D conversion apparatus further includes a duty adjusting circuit capable of adjusting a duty ratio of the reference clock or the reverse clock thereof using a control signal,
wherein duty adjustment of the duty adjusting circuit is controlled by switching the control signal in accordance with whether or not there is a program stored in a non-volatile memory.

8. An A/D conversion apparatus according to claim 1, further duty ratio of the reference clock or the reverse clock thereof using a control signal, wherein duty adjustment of the duty adjusting circuit is controlled by switching the control signal in accordance with whether or not there is a program stored in a non-volatile memory.

9. An A/D conversion apparatus for comparing a reference signal with an analog signal, and when the reference signal matches with the analog signal, outputting a corresponding digital value,
 wherein the A/D conversion apparatus includes a gray code counter for generating the digital value from a reference clock or a reverse clock of the reference clock, and uses a gray code,
 wherein the digital value includes a count value of the gray code counter,
 wherein the count value is a value defined as a most significant bit to a second least significant bit of the digital value and a least significant bit of the digital value is generated from the reference clock or the reverse clock thereof and defined as a least significant bit of the gray code counter,
 wherein the A/D conversion apparatus further includes a duty adjusting circuit capable of adjusting a duty ratio of the reference clock or the reverse clock thereof using a control signal, wherein duty adjustment of the duty adjusting circuit is controlled by switching the control signal in accordance with whether or not a wire is connected to a pad capable of wire bonding.

10. An A/D conversion apparatus according to claim 1, further including a duty adjusting circuit capable of adjusting a duty ratio of the reference clock or the reverse clock thereof using a control signal, wherein duty adjustment of the duty adjusting circuit is controlled by switching the control signal in accordance with whether or not a wire is connected to a pad capable of wire bonding.

11. An A/D conversion apparatus according to claim 3, wherein the signal generating circuit is configured with a delay circuit capable of switching a delay value using a control signal.

12. An A/D conversion apparatus according to claim 11, wherein the delay circuit includes: a first delay circuit, into which the reference clock or the reverse clock thereof is input; a second delay circuit, into which output data of the first delay circuit is input; and a logic circuit, into which each output data of the first delay circuit and the second delay circuit is input, so that delay by the first delay circuit, and delay by the first delay circuit and the second delay circuit can be switched from one another using the control signal.

13. An A/D conversion apparatus according to claim 11, further including a control signal generating circuit for generating the control signal.

14. An A/D conversion apparatus according to claim 11, wherein delay adjustment of the delay circuit is controlled by switching the control signal in accordance with whether or not an electrically or physically disconnectable fuse is disconnected.

15. An A/D conversion apparatus according to claim 11, wherein delay adjustment of the delay circuit is controlled by switching the control signal in accordance with whether or not there is a program stored in a non-volatile memory.

16. An A/D conversion apparatus according to claim 11, wherein delay adjustment of the delay circuit is controlled by switching the control signal in accordance with whether or not a wire is connected to a pad capable of wire bonding.

17. A solid-state image capturing apparatus including therein an A/D conversion apparatus according to claim 1 for performing an A/D conversion on an analog pixel signal read out from a plurality of pixels, the pixels generating a signal charge by a photoelectric conversion of incident light and capturing an image of the incident light.

18. A solid-state image capturing apparatus according to claim 17, wherein the solid-state image capturing apparatus includes a plurality of column signal lines provided in the pixel area for the each pixel column, and to which the analog pixel signal is read from each pixel of a pixel row selected by the row selecting section; and the A/D conversion apparatus converts the analog pixel signal of each pixel, which is read out to each of the plurality of column signal lines simultaneously in a parallel column manner, into each digital pixel value.

19. A solid-state image capturing apparatus according to claim 18, wherein the solid-state image capturing apparatus includes a plurality of column signal lines provided in the pixel area for the each pixel column, and to which the analog pixel signal is read from each pixel of a pixel row selected by the row selecting section; and the A/D conversion apparatus converts the analog pixel signal of each pixel, which is read out to each of the plurality of column signal lines simultaneously in a parallel column manner, into each digital pixel value.

20. An electronic information device including the solid-state image capturing apparatus according to claim 17, used as an image input device, in an image capturing section thereof.

* * * * *